(12) United States Patent
Sung

(10) Patent No.: US 7,888,852 B1
(45) Date of Patent: Feb. 15, 2011

(54) LED HEAT DISSIPATION STRUCTURE

(76) Inventor: Wen-Kung Sung, 6F-3, No. 512, Sec. 4, Zhongxiao Road, Taipei (TW)

( * ) Notice: Subject to any disclaimer, the term of this patent is extended or adjusted under 35 U.S.C. 154(b) by 0 days.

(21) Appl. No.: 12/656,956

(22) Filed: Feb. 22, 2010

(51) Int. Cl.
*H01L 33/00* (2010.01)
*H01L 23/495* (2010.01)

(52) U.S. Cl. .................. 313/46; 313/512; 362/294; 362/612; 362/800; 362/373; 257/675; 257/713; 257/717; 257/720; 257/796

(58) Field of Classification Search .................. None
See application file for complete search history.

(56) References Cited

U.S. PATENT DOCUMENTS

| | | | |
|---|---|---|---|
| 6,943,433 B2 * | 9/2005 | Kamada | 257/666 |
| 7,456,499 B2 * | 11/2008 | Loh et al. | 257/710 |
| 7,719,024 B2 * | 5/2010 | Bando | 257/99 |
| 7,768,122 B2 * | 8/2010 | Oda | 257/710 |
| 7,808,013 B2 * | 10/2010 | Mendendorp et al. | 257/99 |
| 7,815,338 B2 * | 10/2010 | Siemiet et al. | 362/218 |
| 2008/0121921 A1 * | 5/2008 | Loh et al. | 257/99 |
| 2010/0155748 A1 * | 6/2010 | Chan et al. | 257/89 |

\* cited by examiner

*Primary Examiner*—Ashok Patel
(74) *Attorney, Agent, or Firm*—Bacon & Thomas, PLLC

(57) ABSTRACT

A light-emitting diode (LED) heat dissipation structure is provided, including a package body, a heat dissipation frame, at least one light emitting die, a plurality of conductive leads, and a plurality of conductive wires. The package body forms a cavity and has an outside surface. The heat dissipation frame is coupled to the package body and has a portion disposed inside the cavity. The end section of the heat dissipation frame that projects beyond the lateral segment of the outside surface is bent to extend along the outside surface. The light emitting die is accommodated in the cavity and set on the heat dissipation frame. The conductive leads are disposed in the cavity and each extends through a side wall of the cavity to project beyond a lateral segment of the outside surface. The conductive wires connect the light emitting die and the conductive leads inside the cavity.

4 Claims, 8 Drawing Sheets

LED HEAT DISSIPATION STRUCTURE

FIELD OF THE INVENTION

The present invention relates to a light-emitting diode (LED) heat dissipation structure, and in particular to an LED heat dissipation arrangement that comprises a package body that contains therein a heat dissipation frame that extends through and projects outside the package body.

BACKGROUND OF THE INVENTION

Since a light-emitting diode (LED) gives off a great amount of heat during the emission of light, a heat dissipation device must be provided in order to maintain the service life of the light emitting die.

A conventional LED heat dissipation structure, which is designated at 1a in FIGS. 1 and 2. The conventional LED heat dissipation structure comprises a package body 11a inside which first leads 141a and second leads 142a that are opposite to each other are arranged. The first leads 141a respectively carry light emitting dies 13a thereon. With the first leads 141a extending from inside the cavity 111a to outside the package body 11a, the portions of the first lead 141a that are located outside the package body 11a are connected to a top of a circuit board 2a, and heat can thus be dissipated through a heat dissipater element 3a (such as an aluminum substrate) mounted to a bottom of the circuit board 2a. In addition, the heat dissipater element 3a can be assisted by for example a heat dissipation fin, a heat dissipation pipe, a cooling chip, a heat spreader, or a heat dissipation fan, to remove the heat generated by the light emitting dies 13a.

However, the first leads 141a and the second leads 142a are connected to the circuit board 2a. Due to the very narrow conductive traces formed on the circuit board 2a, the first leads 141a and the second leads 142a can only be formed with terminals having very limited areas for connection with the conductive traces of the circuit board 2a, and this imposes an undesired constraint to the expansion of the area for heat dissipation, consequently resulting in disadvantages including poor heat dissipation of the conventional LED's, inefficiency of heat removal, and bulkiness of the assisting heat dissipater devices.

Further, the cost of aluminum substrate based heat dissipater element is high and the cost of the LED heat dissipation structure will be even high raised if the aluminum substrate is to be mounted to the bottom of the circuit board.

SUMMARY OF THE INVENTION

Thus, an objective of the present invention is to provide a light-emitting diode (LED) heat dissipation structure, which comprises a package body coupled to a heat dissipation frame that carries a light emitting die that generates heat, whereby with at least one end section of the heat dissipation frame extending through and projecting outside the package body, the problem of heat removal from the light emitting die is easily overcome.

Another objective of the present invention is to provide an LED heat dissipation structure, wherein leads that electrically connecting a light-emitting die and a heat dissipation frame are formed with the same blank so that they are of the same material and the same thickness, making the LED heat dissipation structure suiting for manufacturing with a stamping process carried out in various known stamping devices, such as a stamping press, without the application of a second manufacturing operation, so as to reduce the waste material, reduce the expense of material, meet the current trend of environmental protection, and reduce the steps of manufacturing process.

To realize the above objectives, according to the present invention, a light-emitting diode (LED) heat dissipation structure is provided, comprising a package body, a heat dissipation frame, at least one light emitting die, a plurality of conductive leads, and a plurality of conductive wires. The package body forms a cavity and has an outside surface. The heat dissipation frame is coupled to the package body and has a portion disposed inside the cavity. The heat dissipation frame has at least one end section extending through at least one side wall of the cavity to project beyond at least one lateral segment of the outside surface. The end section of the heat dissipation frame that projects beyond the lateral segment of the outside surface is bent to extend along the outside surface. The at least one light emitting die is accommodated in the cavity and set on the heat dissipation frame. The plurality of leads comprises at least one first lead and at least one second lead. The first lead and the second lead are disposed in the cavity and each extends through a side wall of the cavity to project beyond a lateral segment of the outside surface. The plurality of wires comprises at least one first wire and at least one second wire. The first wire connects the light emitting die and the first lead inside the cavity, and the second wire connects the light emitting die and the second lead inside the cavity.

The LED heat dissipation structure of the present invention may further comprises a light transmitting body formed inside the cavity for sealing the heat dissipation frame, the light emitting dies, the leads, and the wires inside the cavity.

BRIEF DESCRIPTION OF THE DRAWINGS

The present invention will be apparent to those skilled in the art by reading the following description of preferred embodiments thereof with reference to the drawings, in which.

DETAILED DESCRIPTION OF THE PREFERRED EMBODIMENTS

Figure 1:
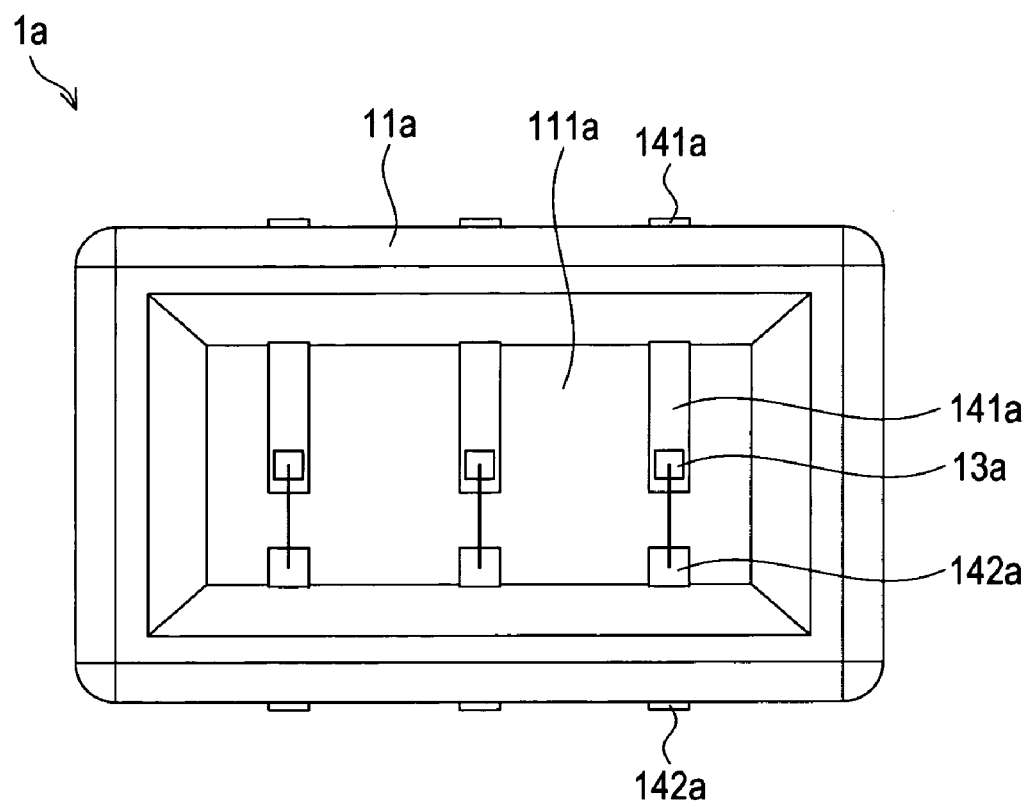
FIG. 1 is a top plan view of a conventional light-emitting diode (LED) heat dissipation structure.
Figure 2:
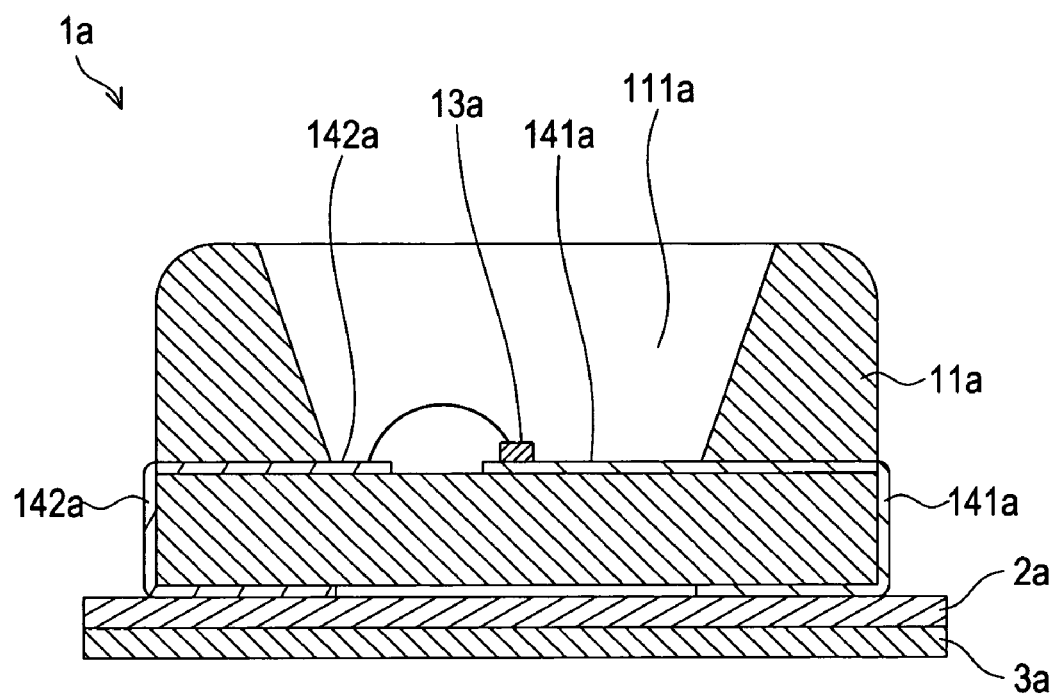
FIG. 2 is a cross-sectional view of the conventional LED heat dissipation structure.
Figure 3:
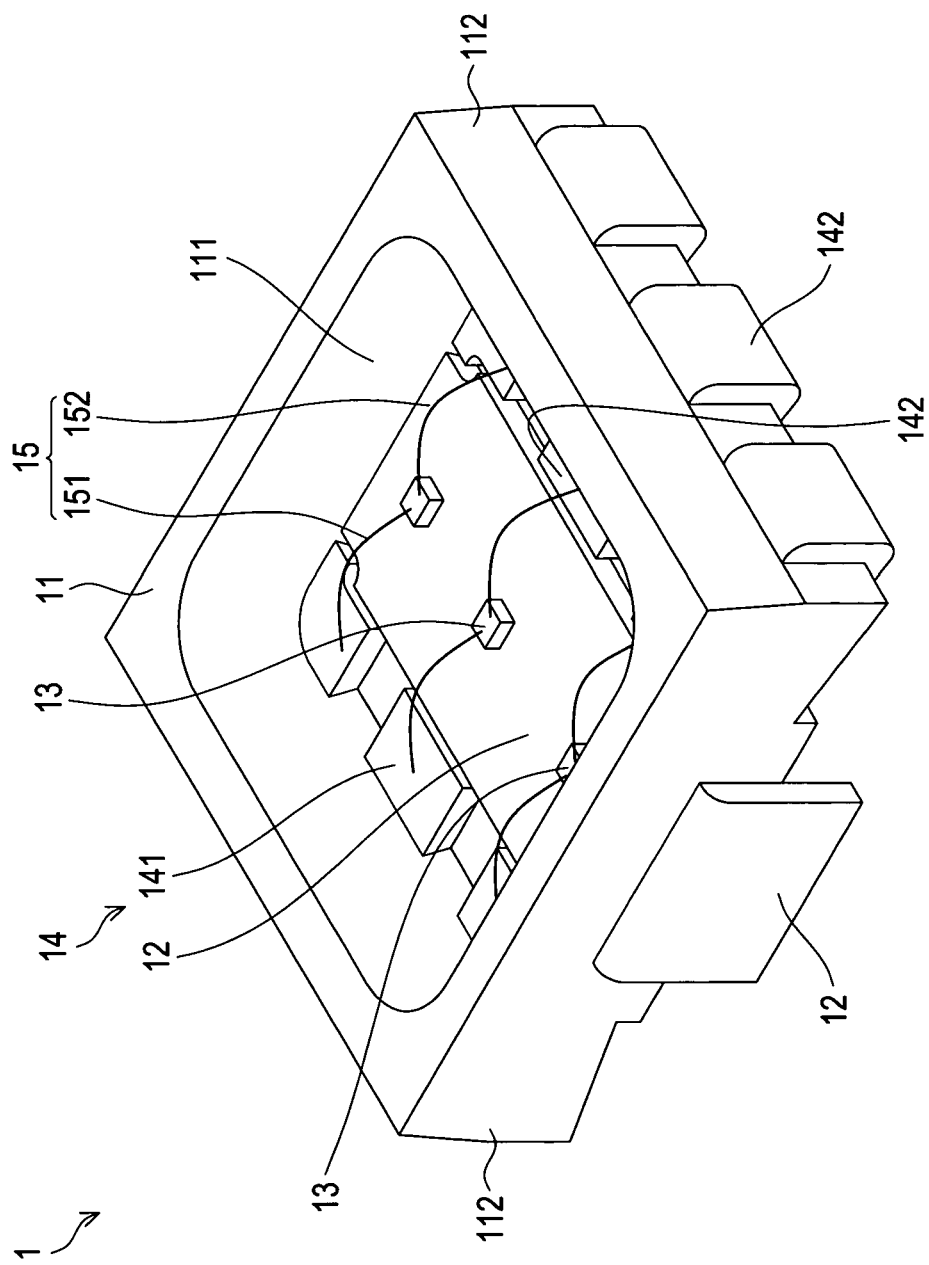
FIG. 3 is a perspective view of an LED heat dissipation structure constructed in accordance with a first embodiment of the present invention.
Figure 4:
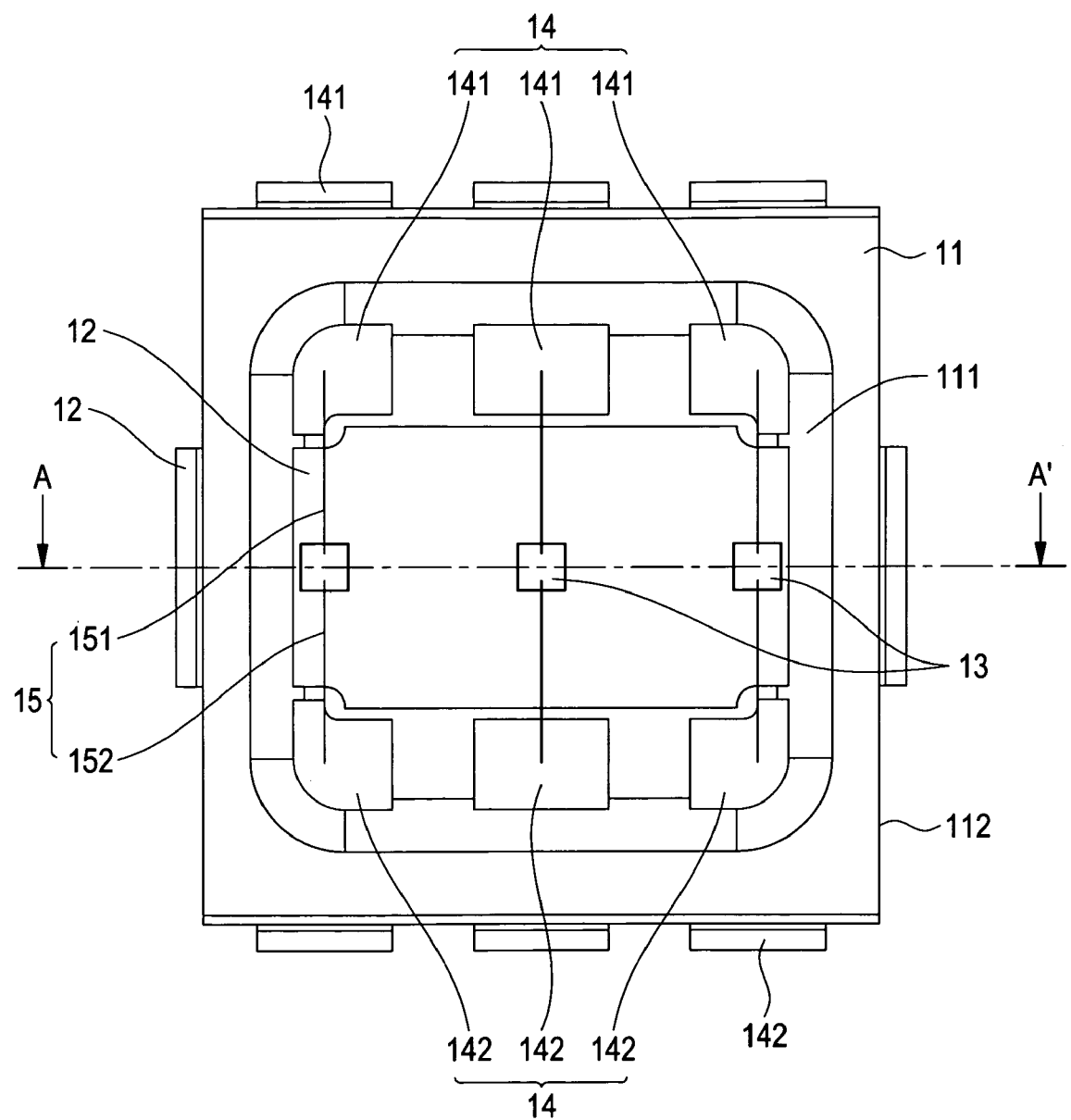
FIG. 4 is a top plan view of the LED heat dissipation structure in accordance with the first embodiment of the present invention.

With reference to the drawings and in particular to FIGS. 3-7, which are respectively a perspective view, a top plan view, a cross-sectional view taken along line A-A', a right side elevational view, and a front side elevational view of a light-emitting diode (LED) heat dissipation structure constructed in accordance with a first embodiment of the present invention, the LED heat dissipation structure of the present invention, generally designated at 1 in the drawings, comprises a package body 11, a heat dissipation frame 12, at least one light emitting die 13, a plurality of conductive leads 14 (including at least a first lead 141 and at least a second lead 142), and a plurality of conductive wires 15. The package body 11 forms a recessed cavity 111 and has an outside surface 112 (as shown in FIGS. 3 and 4).

The heat dissipation frame 12 is coupled to the package body 11 in such a way that a portion of the heat dissipation frame 12 is disposed inside the cavity 111 and located between the first leads 141 and the second leads 142. The heat dissipation frame 12 is made of a metal or a metal alloy. The heat dissipation frame 12 has an end section that extends through a side wall of the cavity 111 to project beyond a lateral segment of the outside surface 112 of the package body 11, and is bent to extend along the outside surface 112 for eventually extending through a circuit board 2. The end section of the heat dissipation frame 12 that extends through the circuit board 2 is then connected to a heat dissipater element 3 (see FIG. 7). For example, the heat dissipation frame 12 is connected to a base of heat dissipation fins.

Similarly, the heat dissipation frame 12 has an opposite end section that extends through an opposite side wall of the cavity 111 to project beyond an opposite lateral segment of the outside surface 112, and is bent to extend along the opposite lateral segment of the outside surface 112 for eventually extending through the circuit board 2. Again, the opposite end section of the heat dissipation frame 12 that extends through the circuit board 2 is also connected to the heat dissipater element 3 (see FIG. 7). For example, the heat dissipation frame 12 is connected to a base of heat dissipation fins.

Further, the circuit board 2 can be a flexible circuit board, such as a flexible printed circuit (FPC) or a rigid circuit board, such as a rigid printed circuit (RPC). At least one light emitting die 13 is accommodated in the cavity 111 and is set on the heat dissipation frame 12. In the embodiment illustrated, three light emitting dies 13 are shown, but the quantity of the dies is not limited to such a number. For example, the quantity of the light emitting die 13 can be one, two, or four, or even more and they are mounted on the heat dissipation frame 12.

Figure 5:
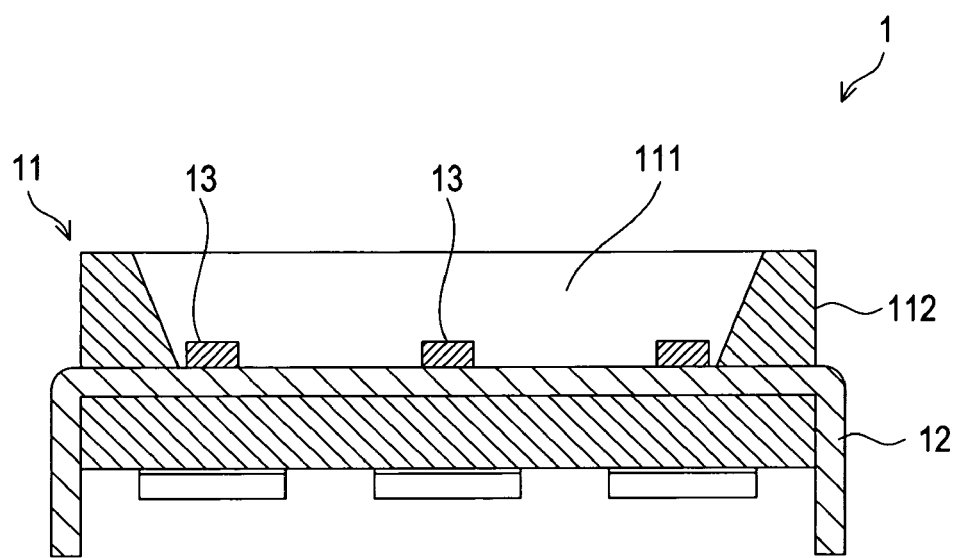
FIG. 5 is a cross-sectional view of the LED heat dissipation structure in accordance with the first embodiment of the present invention taken along line A-A' of FIG. 4.
Figure 6:
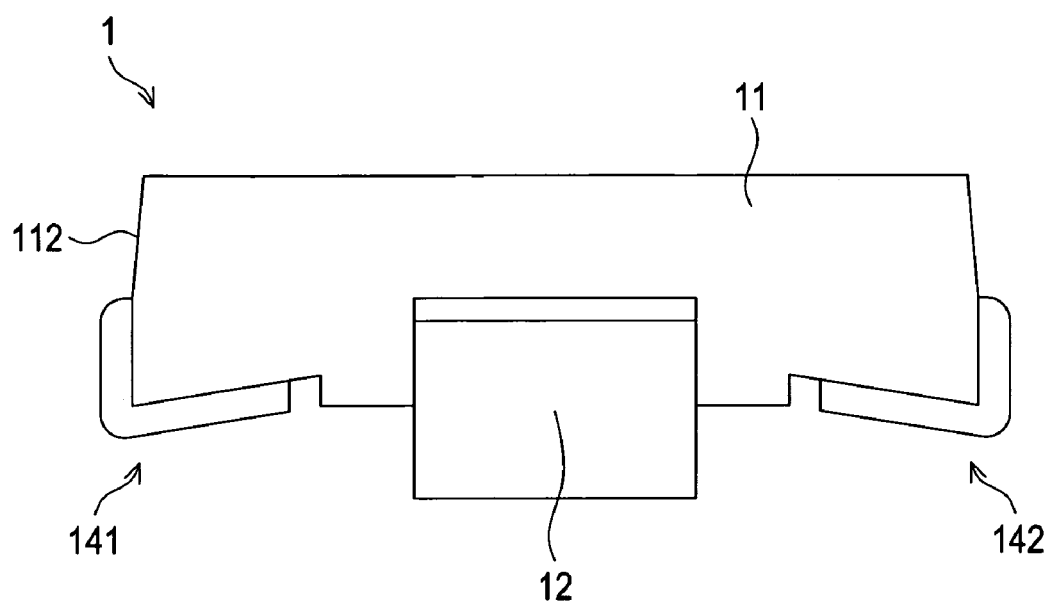
FIG. 6 is a right side elevational view of the LED heat dissipation structure in accordance with the first embodiment of the present invention.
Figure 7:
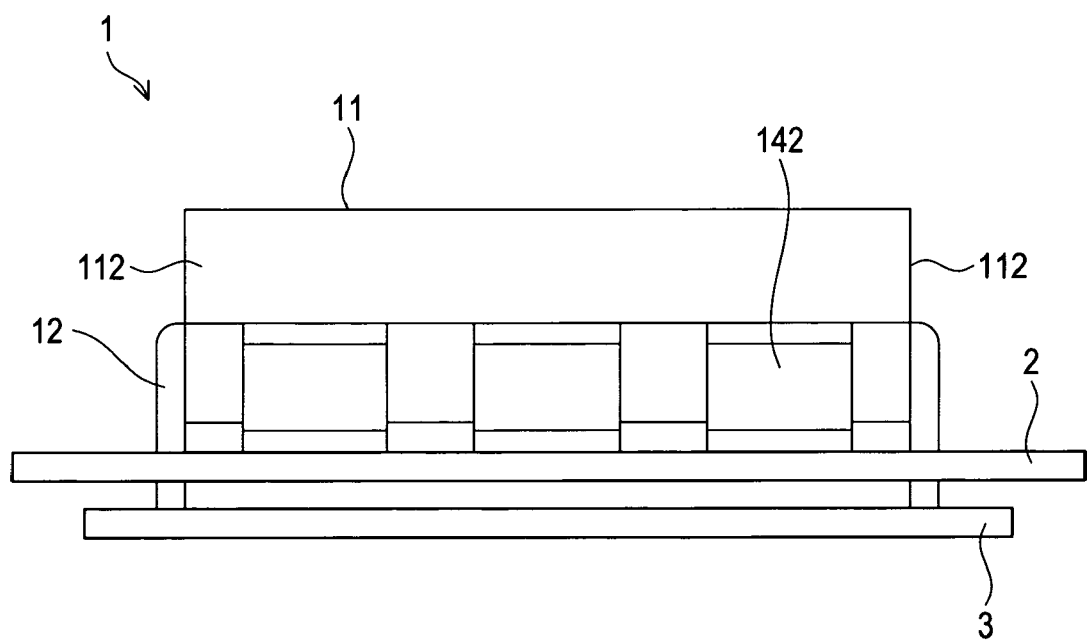
FIG. 7 is a front side elevational view of the LED heat dissipation structure in accordance with the first embodiment of the present invention.

A plurality of conductive leads 14 is provided, including at least a first lead 141 and at least a second lead 142. The first lead 141 and the second lead 142 can have any desired configurations, which are generally not subjected to any constraint. The first and second leads 141, 142 can be of the same configuration, or they are made with different configurations, so that they can be readily set within the limited space inside the cavity 111. The first lead 141 has a portion accommodated in the cavity 111 and an end section of the first lead 141 extends through a side wall of the cavity 111 to project beyond a lateral segment of the outside surface 112 of the package body 11, and is bent to extend along the outside surface 112 of the package body 11 to an intersection between the lateral segment and a bottom segment of the outside surface 112 (as shown in FIGS. 5 and 6). The end section of the first lead 141 is then bent to extend under the bottom segment of the outside surface 112 (namely, an undersurface of the package body 11). In the embodiment illustrated, three bent first leads 141 and three bent second leads 142 are shown, but the quantities of the first and second leads are not limited to such numbers. For example, the quantities of the first lead 141 and the second lead 142 can be one, two, four, or even more.

The second lead 142 has a portion accommodated in the cavity 111 and an end section of the second lead 142 extends through a side wall of the cavity 111 to project beyond a lateral segment of the outside surface 112 of the package body 11, and is bent to extend along the outside surface 112 to an intersection between the lateral segment and the bottom segment of the outside surface 112 (as shown in FIGS. 5 and 6). The end section of the second lead 142 is then bent to extend under the bottom segment of the outside surface 112 of the package body 11 (namely, the undersurface of the package body 11). The end sections of the first and second leads 141, 142 that extend under the undersurface of the package body 11 can be connected to the circuit board 2 through soldering.

The first lead 141, the second lead 142, and the heat dissipation frame 12 can be all formed in male and female molds, so that with a single stamping operation, a metal blank plate can simultaneously form the three components of first lead 141, second lead 142, heat dissipation frame 12, making they formed with the same material and having the same thickness.

A plurality of conductive wires 15 is provided; including first wires 151 and second wires 152. Each of the first wires 151 connects one light emitting die 13 to the corresponding first lead 141 inside the cavity 111. The first wire 151 functions to apply negative electricity from the first lead 141 to the light emitting die 13. Each of the second wires 152 connects one light emitting die 13 to a corresponding second lead 142 inside the cavity 111. The second wire 152 functions to apply positive electricity from the second lead 142 to the light emitting die 13.

Figure 8:
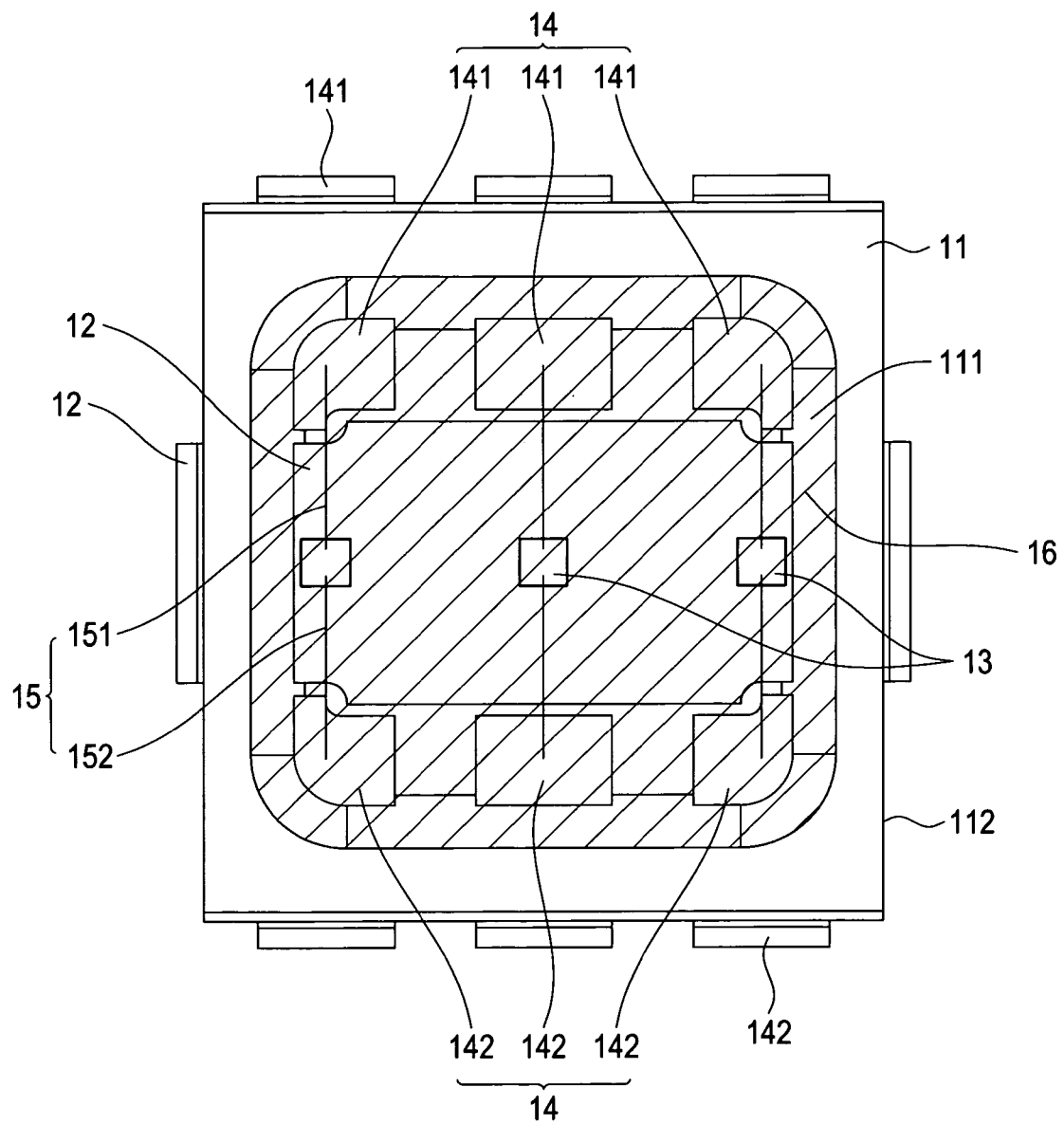
FIG. 8 is a top plan view of an LED heat dissipation structure constructed in accordance with a second embodiment of the present invention.

Referring to FIG. 8, which is a top plan view showing an LED heat dissipation structure constructed in accordance with a second embodiment of the present invention, the LED heat dissipation structure of the second embodiment, also designated at 1, comprises a light transmitting body 16, which is formed inside the cavity 111. The light transmitting body 16 is formed by pouring and curing melt of a light transmitting resin into the cavity 111 for sealing the heat dissipation frame 12, the light emitting die 13, the conductive leads 14, and the conductive wires 15 inside the cavity 111. Further, the light transmitting body 16 may contain therein fluorescent powders, whereby when the light emitting die 13 emits light that transmits through the fluorescent powders and is converted to a different wavelength for emission of a light of different color.

To summarize, the features of the LED heat dissipation structure provided by the present invention are as follows. A heat dissipation frame having a large area is provided, with an end thereof extending through a circuit board and reaching outside a package body, so that the problem of difficult dissipation of heat from the light emitting die can be overcome. Further, an end section of the heat dissipation frame can be coupled to a heat dissipater element 3 (such as heat dissipation fin, a heat dissipation pipe, a cooling chip, heat spreader, or heat dissipation fan) to enhance heat dissipation performed by the heat dissipation frame, whereby the performance of heat dissipation can be significantly improved.

Another feature of the LED heat dissipation structure provided by the present invention is that the heat dissipation frame, the first lead, and the second lead can be formed in such a way that a male mold of a stamping machine is provided with a pattern including a heat dissipation frame, a first lead, and a second lead and is used to stamp a metal plate with a female mold in which a counterpart pattern including a heat dissipation frame, a first lead, and a second lead is formed, whereby the three components of heat dissipation frame, first lead, and second lead can be formed simultaneously. As a consequence, the leads and the heat dissipation frame can be formed by the same stamping operation carried out on the same piece of material to have the same thickness and no second manufacturing process is needed. This reduces the amount of waste material, reduces the expense for metal plates, reduces the steps of manufacturing process, and thus meets the current trend of environmental protection.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A light-emitting diode (LED) heat dissipation structure, comprising:
    a package body, which forms a cavity and has an outside surface;
    a heat dissipation frame, which is coupled to the package body and has a portion disposed inside the cavity, the heat dissipation frame having at least one end section extending through at least one side wall of the cavity to project beyond at least one lateral segment of the outside surface, the end section of the heat dissipation frame that projects beyond the lateral segment of the outside surface being bent to extend along the outside surface;
    at least one light emitting die, which is accommodated in the cavity and set on the heat dissipation frame;
    a plurality of the conductive leads, which comprises at least one first lead and at least one second lead, the first lead and the second lead being disposed in the cavity and each extending through a side wall of the cavity to project beyond a lateral segment of the outside surface; and
    a plurality of the conductive wires, which comprises at least one first wire and at least one second wire, the first wire connecting the light emitting die and the first lead inside the cavity, the second wire connecting the light emitting die and the second lead inside the cavity.

2. The LED heat dissipation structure as claimed in claim 1 further comprising a light transmitting body formed inside the cavity.

3. The LED heat dissipation structure as claimed in claim 1, wherein the end section of the heat dissipation frame is adapted to further extend through a circuit board to couple to a heat dissipater element.

4. The LED heat dissipation structure as claimed in claim 1, wherein the heat dissipation frame and the plurality of the conductive leads are formed in a single stamping operation and have identical thickness.

* * * * *